(12) United States Patent
Lin

(10) Patent No.: US 7,264,501 B1
(45) Date of Patent: Sep. 4, 2007

(54) FIXING MECHANISM

(75) Inventor: Linger Lin, Taipei (TW)

(73) Assignee: Inventec Corporation (TW)

( * ) Notice: Subject to any disclaimer, the term of this patent is extended or adjusted under 35 U.S.C. 154(b) by 0 days.

(21) Appl. No.: 11/508,413

(22) Filed: Aug. 22, 2006

(51) Int. Cl.
*H02B 1/01* (2006.01)
(52) U.S. Cl. .................. 439/571; 174/138 G; 361/758
(58) Field of Classification Search ................ 439/92, 439/95, 571; 174/138 D, 138 G; 361/742, 361/758, 804
See application file for complete search history.

(56) References Cited

U.S. PATENT DOCUMENTS

| | | | | |
|---|---|---|---|---|
| 5,018,982 | A * | 5/1991 | Speraw et al. ................. | 439/74 |
| 6,377,445 | B1 * | 4/2002 | Davis et al. ................. | 361/683 |
| 6,726,505 | B2 * | 4/2004 | Cermak et al. ............. | 439/567 |
| 6,863,562 | B1 * | 3/2005 | Jensen et al. ............... | 439/571 |
| 6,995,982 | B2 * | 2/2006 | Gonzalez et al. ........... | 361/758 |

* cited by examiner

*Primary Examiner*—Khiem Nguyen
(74) *Attorney, Agent, or Firm*—Peter F. Corless; Steven M. Jensen; Edwards Angell Palmer & Dodge LLP

(57) ABSTRACT

The invention provides a board-shaped fixing mechanism, which is adapted to fasten a planar board having a plurality of first positioning portions onto a carrier board, and includes a plurality of second positioning portions adapted to correspondingly couple with the first positioning portions, a fastening member disposed between the planar board and the carrier board, and at least one fixing portion for fastening the fastening member to the carrier, the fastening member being provided with a blocking portion for blocking the planar board, and an elastic portion for actuating the blocking portion to block the planar board by propping up to abut against and support one side of the planar board to restrict it from moving in both vertical and lateral directions, thereby fastening the planar board without having to use any tool to resolve the drawbacks of prior techniques.

12 Claims, 10 Drawing Sheets

FIXING MECHANISM

BACKGROUND OF THE INVENTION

1. Field of the Invention

The present invention relates to fixing mechanisms, and more particularly, to a fixing mechanism fox fixing a planar member to a carrier board of an electronic product.

2. Description of Related Art

A conventional method of installing a PCB or an extension card of board-shaped structures in a computer or a server is to simply screw the PCB to bosses or other mounting structures suitably mounted on a chassis. However, this fixing method of installing a PCB by screws has disadvantages in operation as it necessitates the use of tools, the labor and the time spent in assembly and disassembly for replacement or maintenance purposes, decreasing the working efficiency as a result.

To increase the efficiency of installing a PCB in a computer, Taiwanese Utility Patent No. M269690 discloses an improved technique for fastening a PCB without using screws, as depicted in FIG. 1. As shown in the drawing, the fixing mechanism disclosed by Taiwanese Utility Patent No. M269690 fastens a PCB 1 onto a carrier board 4 formed with a plurality of fastening pillars 40, each fastening pillar consisting of a bottom portion 401, a neck portion 402 extending upward from the bottom portion 401, and a head portion 403 extending upward from the neck portion 402; the fixing mechanism is provided with a plurality of elastic tabs 2, wherein each elastic tab 2 consists of a protruding tip 22 disposed on the bottom surface, a first bending portion 24 disposed at a position away from the protruding tip 22, a fastening aperture 25 disposed between the protruding tip 22 and the first bending portion, an extending portion 28 disposed at a side position away from the protruding tip 22, and a positioning portion 29 disposed between the extending portion 28 and the first bending portion 24, wherein the fastening aperture 25 comprises a guide-in hole 251 and a mating hole 252.

In applying the foregoing fixing mechanism, the positioning portion 29 thereof is used to insert in a through aperture 16 of the PCB 1, while the pair of protruding tips 22 is inserted in the positioning aperture 14 of the PCB 1, allowing the elastic tabs to be clipped and held on the PCB 1; subsequently, the plurality of fastening pillars 40 formed on the carrier board 4 is inserted into the through hole 12 and the guide-in hole 251 to expose the head portion 403 of the fastening pillar 40, so as to push the PCB 1 so that the first bending portion 24 on the elastic tab 2 is pressed to elastically deform downwardly that enables the extending portion 28 to extend outward to a grounding tab 18, thereby fastening the PCB 1 onto the carrier board 4 by means of the clipping force generated from the flexible deformation of the elastic tab 2 when the neck portion 402 of the fastening pillar 40 slides into the mating hole 252. On the other hand, in disassembly, the PCB 1 is pushed to slide along in a reverse direction so that the neck portion 402 of the fastening pillar 40 slides into the guide-in hole 251 to disassemble the PCB 1.

While the above patented technique of using a plurality of elastic tabs to install a PCB eliminates the use of any auxiliary tool such as screws, it produces nevertheless other problems in that it necessitates using a plurality of elastic tabs in applying the technique, thereby inadvertently increasing the components required and the material cost as a result, and also creating an issue of components management as well for disassembling operation.

Moreover, as elastic tabs are unable to withstand and resist the level force of the PCB and thus liable to detach from a computer chassis when moving along at lateral directions that are caused by accidental vibrations or collisions. Further, the fastening pillars are generally produced by machinery processing and thus inherent with a common difference in manufacturing, and in the case that the perpendicular distance between the upper and lower surface of the neck portion thereof is made too big to completely press and tighten the first bending portion of the elastic tab, the elastic tab cannot be fully squeezed to deform and generate a sufficient clipping force that is necessary to clasp the PCB in position and is likely to cause the PCB to move up and down as a result.

Also, in the case of a PCB being installed in a non-plane surface, it is necessary to use auxiliary components or structures for support and prevent the elastic tabs from coming off, which reduces the convenience of installation in addition to the complexity of forming pluralities of through holes, positioning holes, penetrating holes and grounding tabs on the elastic tab to achieve the effect of fastening. In short, the use of elastic tabs advertently has drawbacks in that it may affect the design of a PCB wiring, reduce the flexibility of wiring design that may even force the wiring space to be reduced and thus limit the upgrade of functionality, and also occupy valuable spaces required for operation and configuration and goes against a development trend of miniaturization of electronic products.

Therefore, it is desirable to develop a novel mechanism to facilitate installation of a PCB in a computer that is easy, convenient to operate and also is economical.

SUMMARY OF THE INVENTION

The present invention aims to improve on the aforementioned drawbacks, and, as such, a primary objective of the present invention is to provide a board-shaped fixing mechanism that is easy and fast to install and disassemble without the use of tools.

Another objective of the present invention is to provide a board-shaped fixing mechanism that is energy-saving to install and disassemble.

Another objective of the present invention is to provide a board-shaped fixing mechanism that can reduce the number of components required for installation.

Another objective of the present invention is to provide a board-shaped fixing mechanism that is convenient in terms of material component management.

Another objective of the present invention is to provide a board-shaped fixing mechanism that is economical and cost-effective as it can be produced at low cost.

Another objective of the present invention is to provide a board-shaped fixing mechanism that can restrict movements of a PCB in both perpendicular and lateral directions to achieve the effect of fastening.

Another objective of the present invention is to provide a board-shaped fixing mechanism that provides more flexibilities in product designing.

In order to achieve the above and other objectives, the present invention provides a board-shaped fixing mechanism, which is adapted to fasten a planar board having a plurality of first positioning portions onto a carrier board, and a plurality of second positioning portions disposed on the carrier board to correspondingly couple with the first positioning portions; at least a fixing portion disposed on the carrier board for fastening the fastening member to the carrier board; a fastening member disposed between the planar board and the carrier board and including at least a second fixing portion for connecting with a first fixing portion, a blocking portion for blocking the planar board, and an elastic portion for actuating the blocking portion to block the planar board by propping up to abut against and support one side of the planar board; preferably, wherein the second fixing portion, the elastic portion, and the blocking portion are integrally formed.

In one preferred embodiment, the board-shaped fixing mechanism further includes a first mating portion disposed on the carrier board whereas one side of the fastening member thereof may be provided with a second mating portion in a protrusive manner corresponding to the first mating portion; in another embodiment, the fastening member of the fixing mechanism further includes a third positioning portion that may be formed with an opening for the second positioning portion to insert therein.

In summary, the board-shaped fixing mechanism of the invention features using the inherent elasticity thereof to fasten the planar board onto the carrier board, and also does not require extra components and auxiliary tools in disassembly, thereby solving the drawbacks of the conventional installation methods by screws that substantially increase the time, and thus the cost, required to construct the computer in addition to adding to the complexity and difficulty of assembling, and later disassembling and servicing the computer.

In addition, the board-shaped fixing mechanism of the invention employs a blocking portion thereof to block one side of the planar board that effectively solve the problem of elastic tabs used in prior techniques that cannot not prevent the fastening board from moving laterally as a result of accidental vibrations or collisions. Moreover, the invention employs the elasticity of the elastic portion thereof to support the planar board to avoid the problem of fixing pillars incapable of fully pressing the elastic tabs for generating sufficient holding strength that is required to hold and restrict the PCB from moving in a perpendicular direction.

Furthermore, the invention only uses a fastening member to fasten the planar board without requiring the disposal of a corresponding structure to eliminate the defects in prior techniques that necessitates disposal of pluralities of positioning holes and grounding tabs and the potential problems resulting therefrom, providing more varieties and flexibilities in designing different aspects of a product.

Accordingly, the present invention offers advantages over prior art techniques in that it is not only easy and fast to install and disassemble, but also is cost-effective and reliable to implement.

BRIEF DESCRIPTION OF DRAWINGS

The fixing mechanism of the present invention can be fully understood by reading the following detailed description of the preferred embodiments, with reference made to the accompanying drawings, wherein:

FIGS. 3A and 3B are assembled views of FIG. 2, in which FIG. 3A is a downcast view and FIG. 3B is a side cutaway view of FIG. 3A;

FIGS. 4A and 4B are schematic views of a fixing mechanism in accordance with a second embodiment of the present invention, in which FIG. 4A is a downcast view and FIG. 4B is a side cutaway view of FIG. 4A;

FIGS. 5A and 5B are schematic views of a fixing mechanism in accordance with a third embodiment of the present invention, in which FIG. 5A is a downcast view and FIG. 5B is a side cutaway view of FIG. 4A; and FIGS. 6A and 6B are schematic views of a fixing mechanism in accordance with a fourth embodiment of the present invention, in which FIG. 6A is a downcast view and FIG. 6B is a side cutaway view of FIG. 6A.

DETAILED DESCRIPTION OF PREFERRED EMBODIMENT

The present invention is described in the following so that one skilled in the pertinent art can easily understand other advantages and effects of the present invention.

The present invention may also be implemented and applied according to other embodiments, and the details may be modified based on different views and applications without departing from the spirit of the invention.

The First Embodiment

Figure 1:
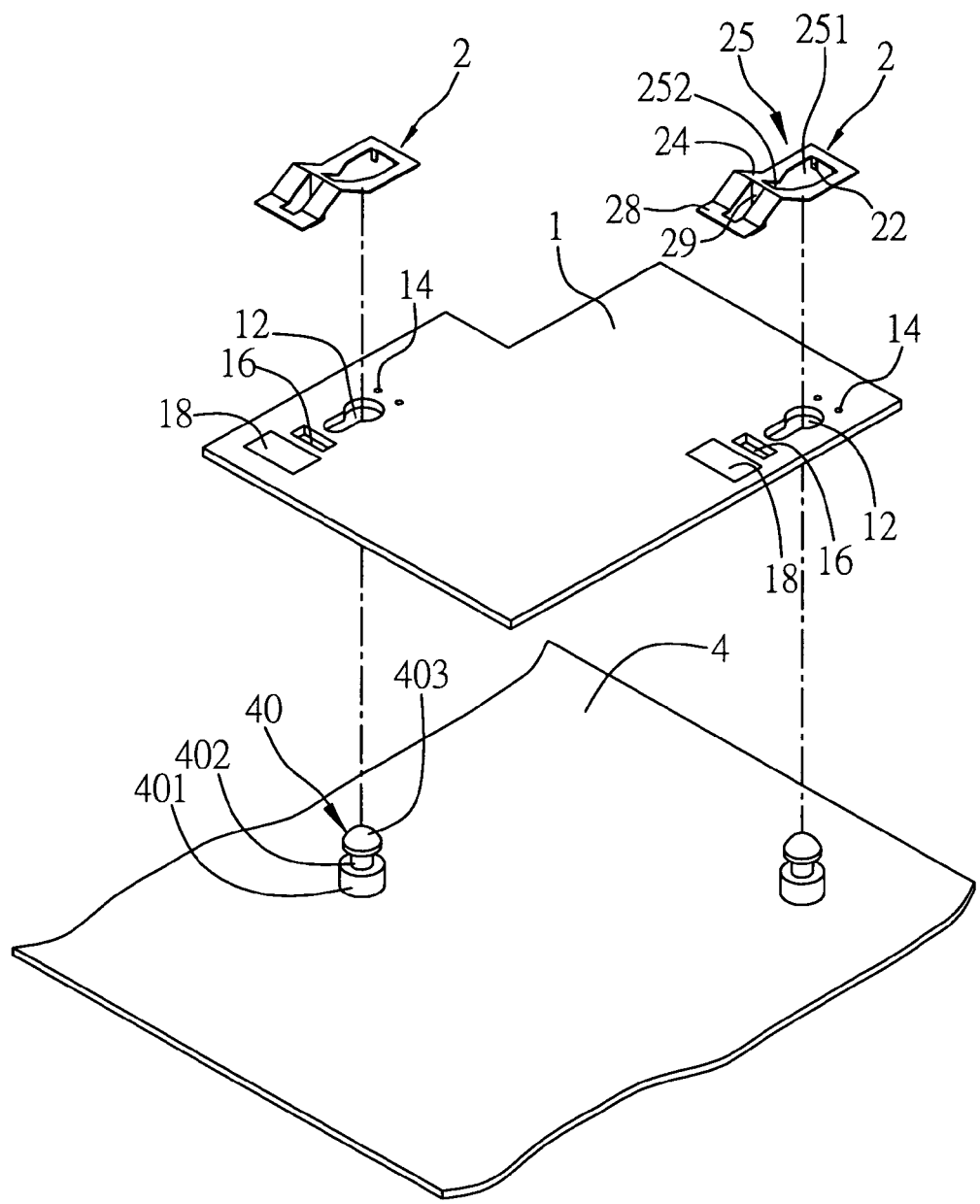
FIG. 1 (PRIOR ART) is an exploded, isometric view of a conventional fixing mechanism.
Figure 2:
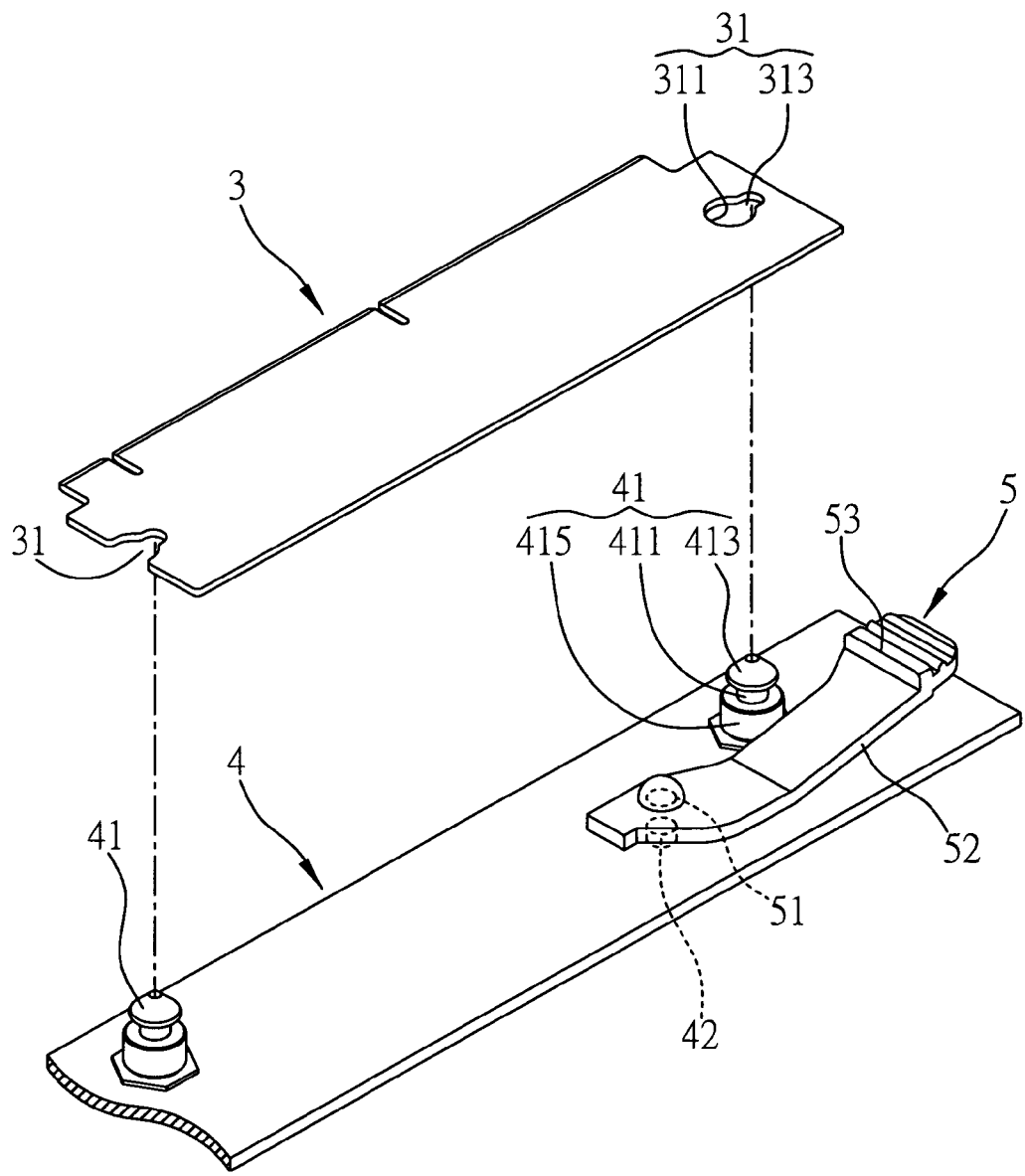
FIG. 2 is an exploded, isometric view of a fixing mechanism in accordance with a preferred embodiment of the present invention.
Figure 3A:
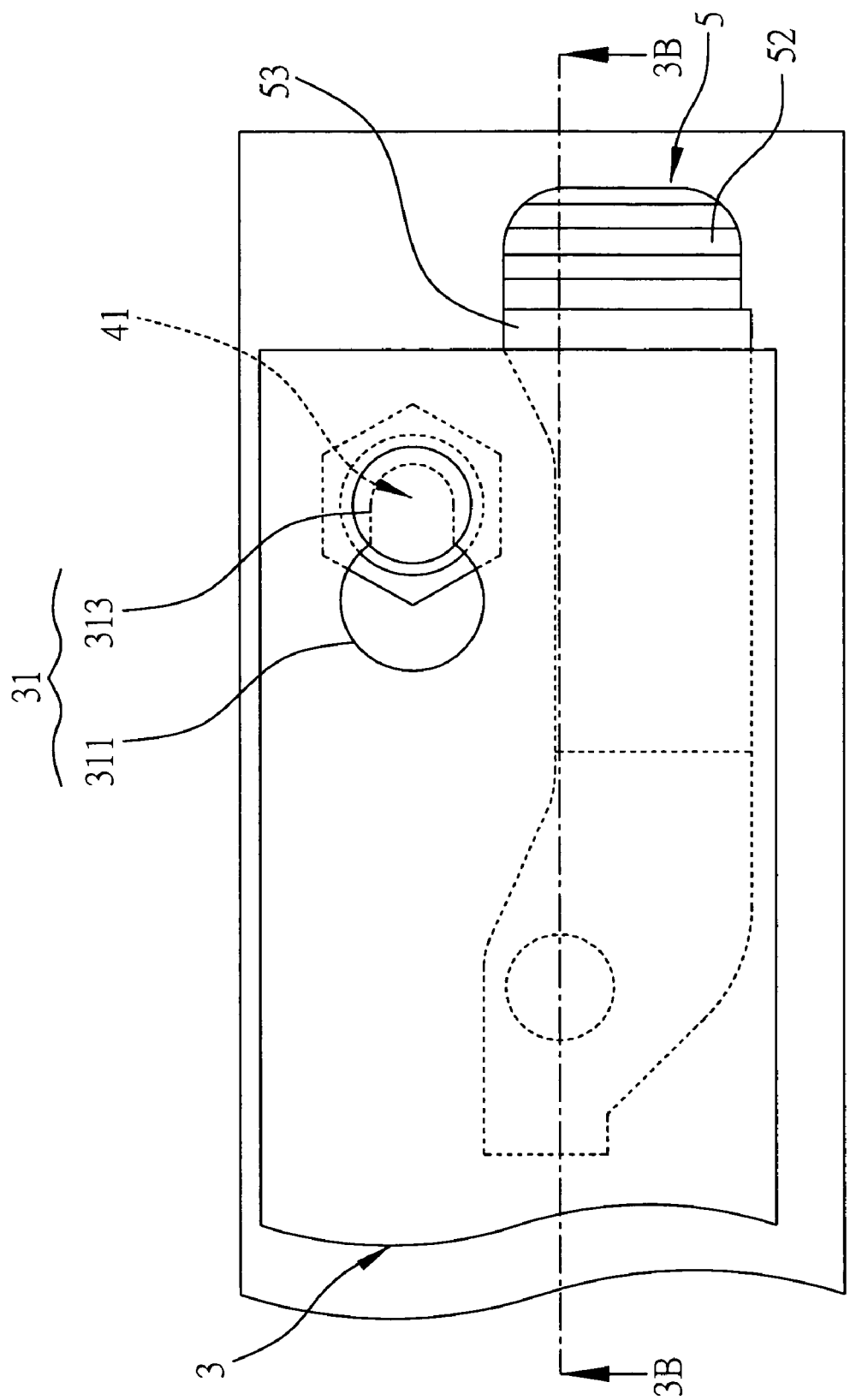
Figure 3B:
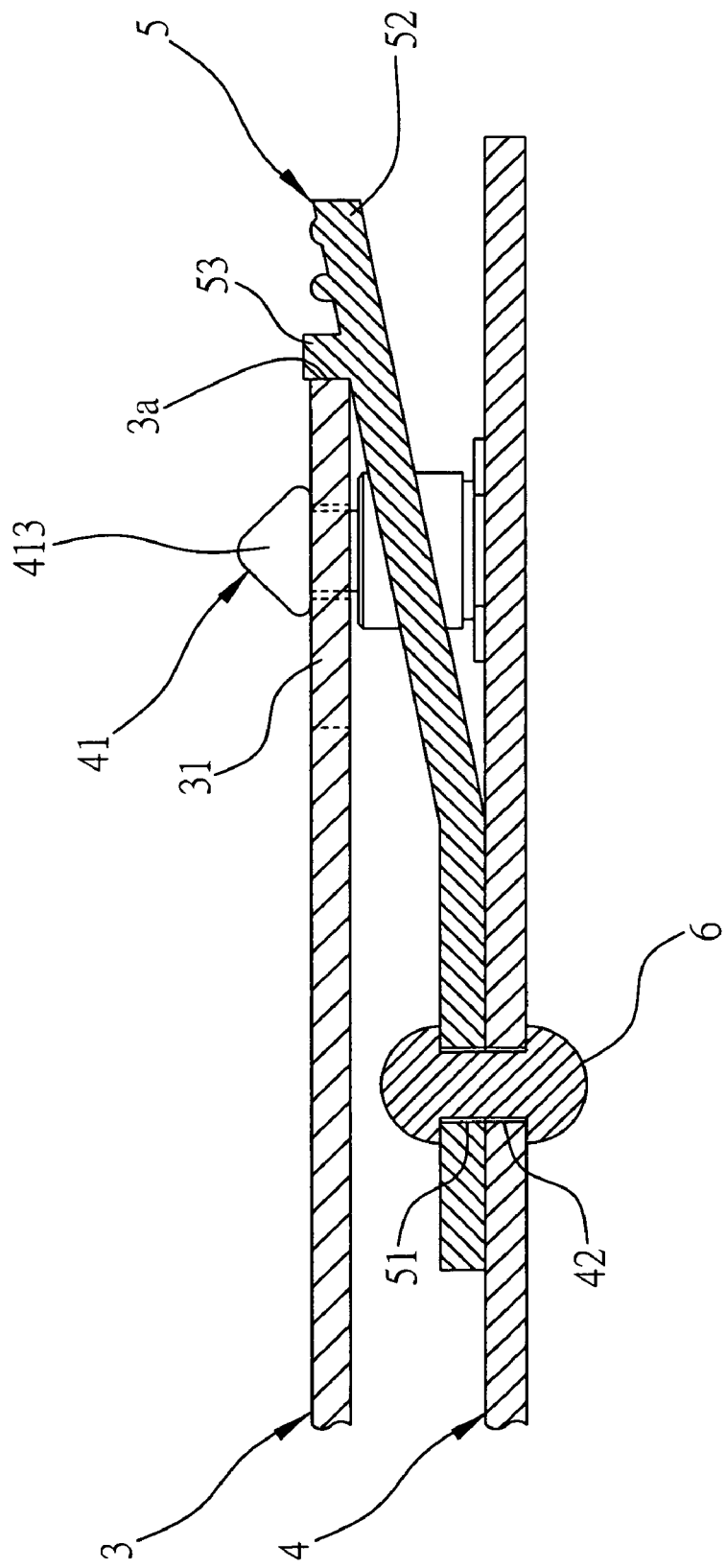

FIG. 2 through FIG. 3B are schematic views of a planar board in accordance with a first embodiment of the invention. FIG. 2 is an exploded view of the planar board of the preferred embodiment of the invention; FIGS. 3A and 3B are assembled views of FIG. 2 in which FIG. 3A is a downcast view and FIG. 3B is a side-cutaway view of FIG. 3A.

As shown in FIG. 2, the fixing mechanism of the invention includes a plurality of first positioning portions 31 for fastening a planar board 3 onto a carrier board 4; a plurality of second positioning portions 41 disposed on the carrier board 4 for correspondingly coupling with the first positioning portions 31; at least a fixing portion 42 disposed on the carrier board 4, and a fastening member 5 for connecting with the first fixing portion 42 to secure one side of the planar board 3.

The planar board 3 may be a PCB, an extension card or other components to be securely installed in a computer or a server. Note that a PCB is exemplified in this embodiment but is not intended to be restrictive. The planar board of this embodiment comprises a plurality of positioning portions 31 which are through holes consisting of a first arc 311 and a second arc 313 that has a relatively smaller diameter than the first arc 311, but is not limited to, for connecting the first arc 311.

The second positioning portion 41 is disposed on a side edge of the fastening member 5 and may be a pillar. In this embodiment, the second positioning portion 41 includes a bottom pillar 415, a neck pillar 411 formed on the top of the bottom pillar 415, and a sharp pillar 413 formed on the top of the neck pillar 411, wherein the width of the neck pillar is made to correspond to the thickness of the planar board 3, and the diameter of the neck pillar 411 is equal to that of the second arc 313 for mating with the first positioning portion 31; the maximum diameter of the sharp pillar 413 is smaller than that of the first art 311 to allow for penetration through the first arc 311; the bottom pillar 415 is adapted to support the planar board 3 and to keep an appropriate distance between the planar board 3 and the carrier board 4, wherein the first positioning portion 42 may be a through aperture.

The fastening member 5 may be a plastic, a metallic or other flexible equivalents that can be pressed to deform and return to its original shape when the pressure is released, wherein the fastening member 5 is comprised of at least a second fixing portion 51 for connecting with the first fixing portion 42, an elastic portion 52 extending upward from a side of the second fixing portion 51, and a blocking portion 53 connecting the elastic portion 52 for abutting against one side of the planar board 3.

The second fixing portion 51 may be, for example, a through aperture for correspondingly connecting with the first fixing portion 42; preferably, the first fixing portion 42 and the second fixing portion 51 are fastened to connect with one another by rivets so as to fasten the fastening member 5 onto the carrier board 4. In this embodiment, a rivet member 6 is used to couple the first fixing portion 42 and the second fixing portion 51. Note that although one second fixing portion 51 is adapted to correspond with one first fixing portion 42, the number, the structure and the rivet coupling means are not to be limited to what disclosed in this embodiment.

The height difference formed between the extending end of the elastic portion 52 and the second fixing portion 51 is equal to the height of the bottom pillar 415 thereof. The blocking portion 53 extends perpendicularly and upward from the elastic portion 52 and may be, for example, a protruding rib, a stopping block or other equivalents capable of withstanding and resisting the level pushing force of the planar board 3, and the top surface of the blocking portion 53 is a little higher than the sharp pillar 413 thereof.

In applying the planar board of the invention, one may exert some force on one side of the elastic portion 52 thereof, enabling the elastic portion 52 to move toward the carrier board 4 and accumulate the elasticity; next, the first positioning portion 31 is put into the second positioning portion 41, allowing the sharp pillar 413 to penetrate through the first arc 311 of the first positioning portion 31; subsequently, the force exerted thereupon is released to loosen the elastic portion 52; and, as the extending end of the elastic portion 52 exceeds one edge side 3a of the planar board 3, the elasticity generated by releasing the elastic portion 52 relative moves the blocking portion 53 to abut against the edge side 3a of the planar board 3, such that the planar board 3 moves in left direction to enable the sharp pillar 413 to position in the second arc 313, thereby tightly coupling the first positioning portion 31 with the second positioning portion 41 and fastening the planar board 3 onto the carrier board 4. Further, as the top of the blocking portion is higher than the sharp pillar 413 thereof, when the blocking portion 52 abuts against the side edge 3a of the planar board 3, the top of the blocking portion 53 is lower than the sharp pillar 413 but higher than the top of the planar board 3, thereby preventing the planar board 3 from moving in level direction, while the elasticity generated by the elastic portion 52 can support the planar board 3 and prevent it from moving in a perpendicular direction, thereby ensuring that the planar board 3 is securely fastened.

In disassembly, on the other hand, one may exert some force on the elastic portion 52 thereof to make the top of the blocking portion 53 lower than that of the planar board 3 to disengage from one side of the planar board 3; so that the sharp pillar 413 thereof is moved from the second arc 313 to the first arc 311 that loosens the first positioning portion 31 from the second positioning portion 41 so as to remove the planar board 3 from the carrier board 4.

From the description and illustration of the drawing, it can be seen clearly that the present invention employs the elasticity of a single fastening member for the installation and disassembly of the planar board without using any tool and that is easy and efficient to operate. Also, the invention requires only one fastening member for each planar board, which, compared to prior techniques, necessitates use of elastic tabs, is more cost-effective and economical as it can reduce the number of required components; moreover, the second fixing portion, the elastic portion, the blocking portion can be integrally formed with the planar board to simplify the manufacturing steps and produce at low cost. Further, the planar board of this preferred embodiment is installed by rivets to fasten onto the carrier board 4, thereby eliminating a burden of components management to increase the convenience of operations.

The Second Preferred Embodiment

Figure 4A:
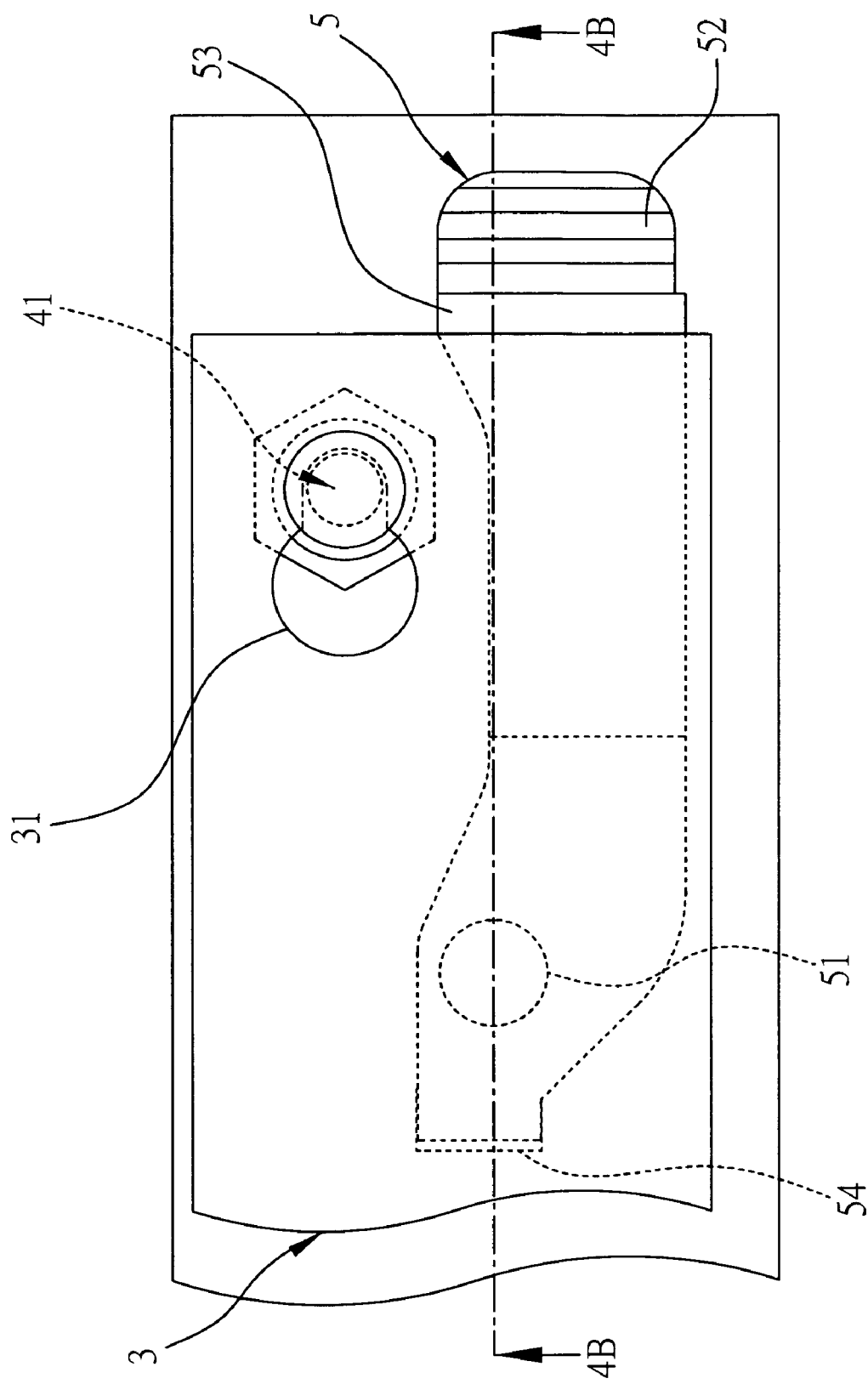
Figure 4B:
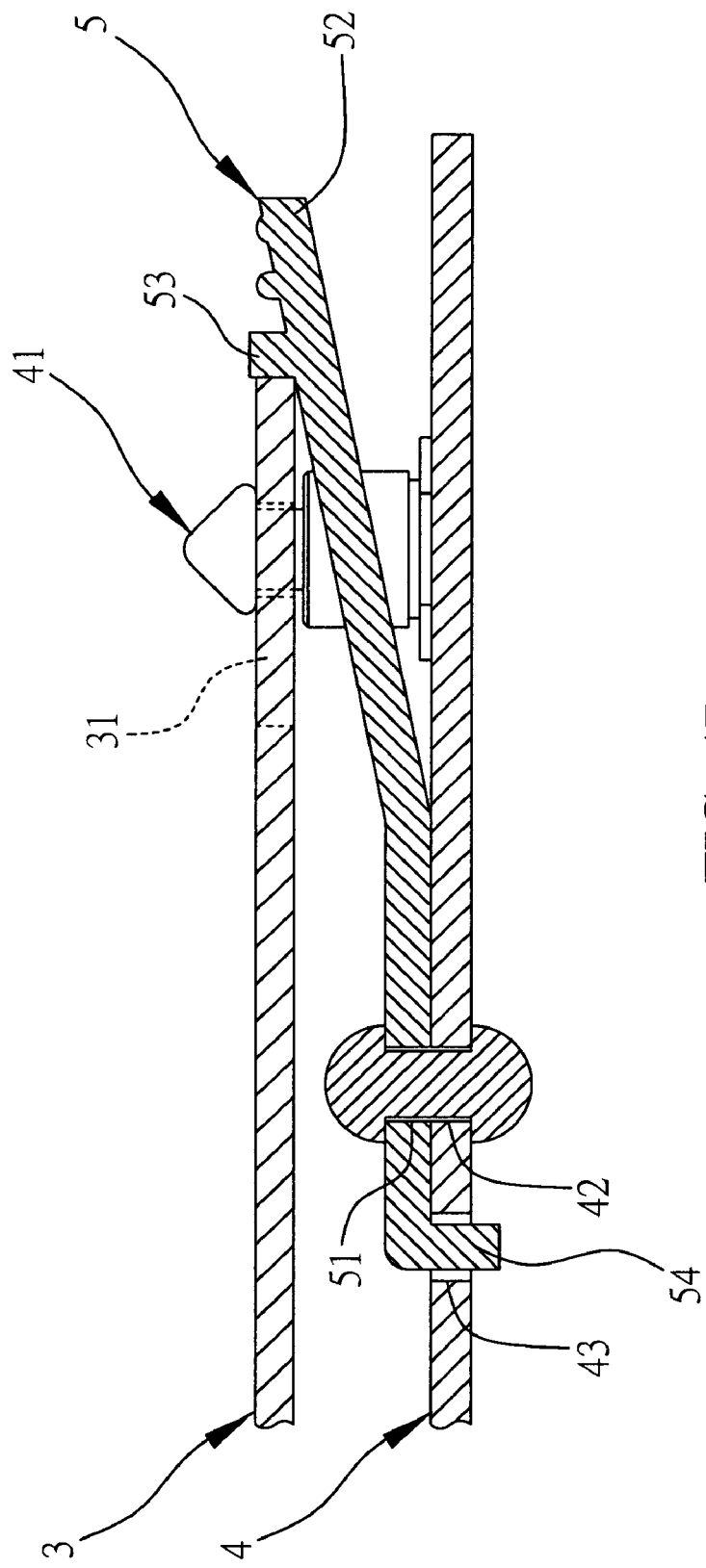

FIGS. 4A and 4B are schematic views of a fixing mechanism in accordance with a second embodiment of the present invention, in which FIG. 4A is a downcast view and FIG. 4B is a side cutaway view of FIG. 4A, and note that components that are identical or similar to those of the first embodiment are shown by identical or similar reference numerals and the description thereof is omitted herein for clarity and brevity.

As shown in the drawings, the planar board of this embodiment is substantially the same as the foregoing embodiment, and only differs in that the planar board further includes a first mating portion 43 disposed on the carrier board 4 and the fastening member 5 further comprises a second mating portion 54.

The first mating portion 43 may be a through aperture whereas the second mating portion 54 is disposed on one side of the fastening member 5 in a protrusive manner, for example, on one side of the second fixing portion 51 at a position away from the elastic portion 52, and the second mating portion 54 extends in reverse direction from the elastic portion 52, that is, extends toward the direction of the carrier board 4. In this embodiment, the second mating portion 54 extends perpendicularly toward the direction of the carrier board 4, thereby coupling the second mating portion 54 with the first mating portion 43.

As can be seen clearly from this embodiment, the planar board of this embodiment employs the first mating portion 43 and the second mating portion 54 to prevent the planar board from rotating and moving between the fastening member 5 and the planar board 4, further securing the fastening member 5 onto the carrier board 4.

The Third Preferred Embodiment

Figure 5A:
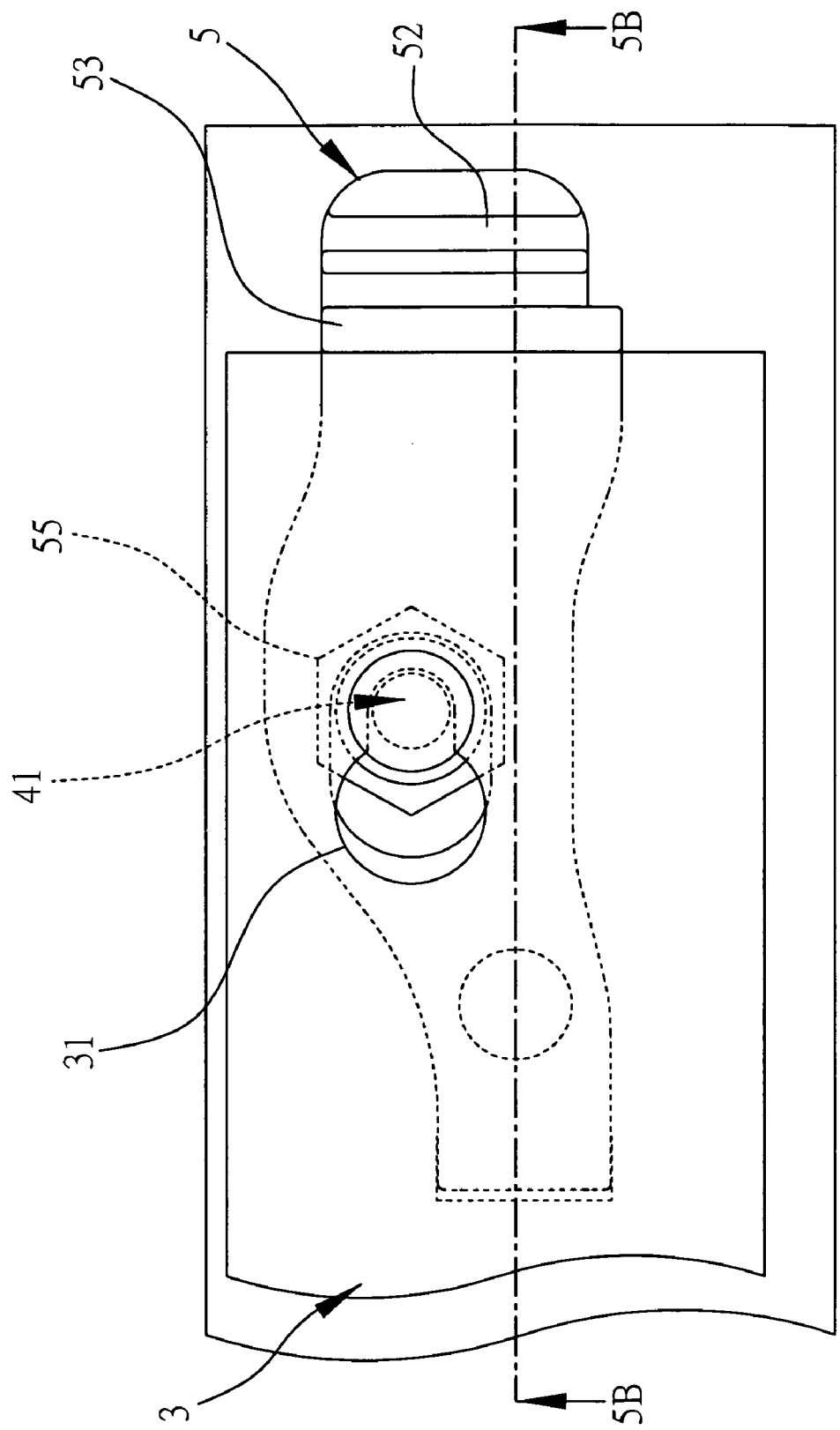
Figure 5B:
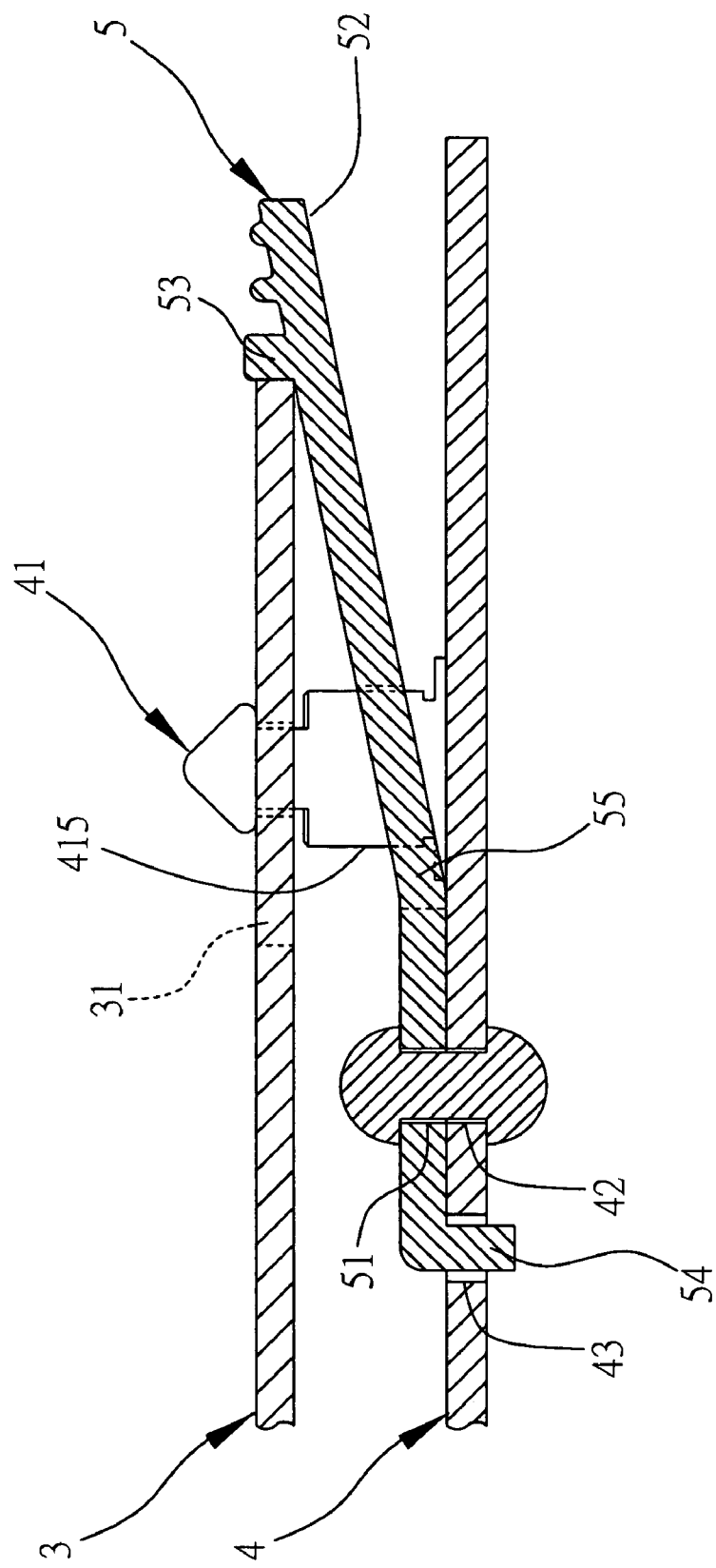

FIGS. 5A and 5B are schematic views of a fixing mechanism in accordance with a third embodiment of the present invention, in which FIG. 5A is a downcast view and FIG. 5B is a side cutaway view of FIG. 5A, and note that components that are identical or similar to those of the second embodiment are shown by identical or similar reference numerals and the description thereof is omitted herein for clarity and brevity.

As shown in the drawings, the planar board of this embodiment is substantially the same as the foregoing preferred embodiment, and only differs in that the second positioning portion 41 thereof penetrates through the fastening member 5 while the second positioning portion 41 is disposed on one side of the fastening member in the previous embodiment.

In this embodiment, the planar board further includes a third positioning portion 55 adapted for penetrating the elastic portion 52 of the fastening member 5, wherein the third positioning portion 55 is an opening and the diameter thereof is larger than the step pillar 415 to allow for penetration of the second positioning portion 41 through the third positioning portion 55, thereby securing the planar board on the carrier board 4 by the fastening member 5 and further reducing the space occupied by the planar board to facilitate space design.

The Fourth Preferred Embodiment

Figure 6A:
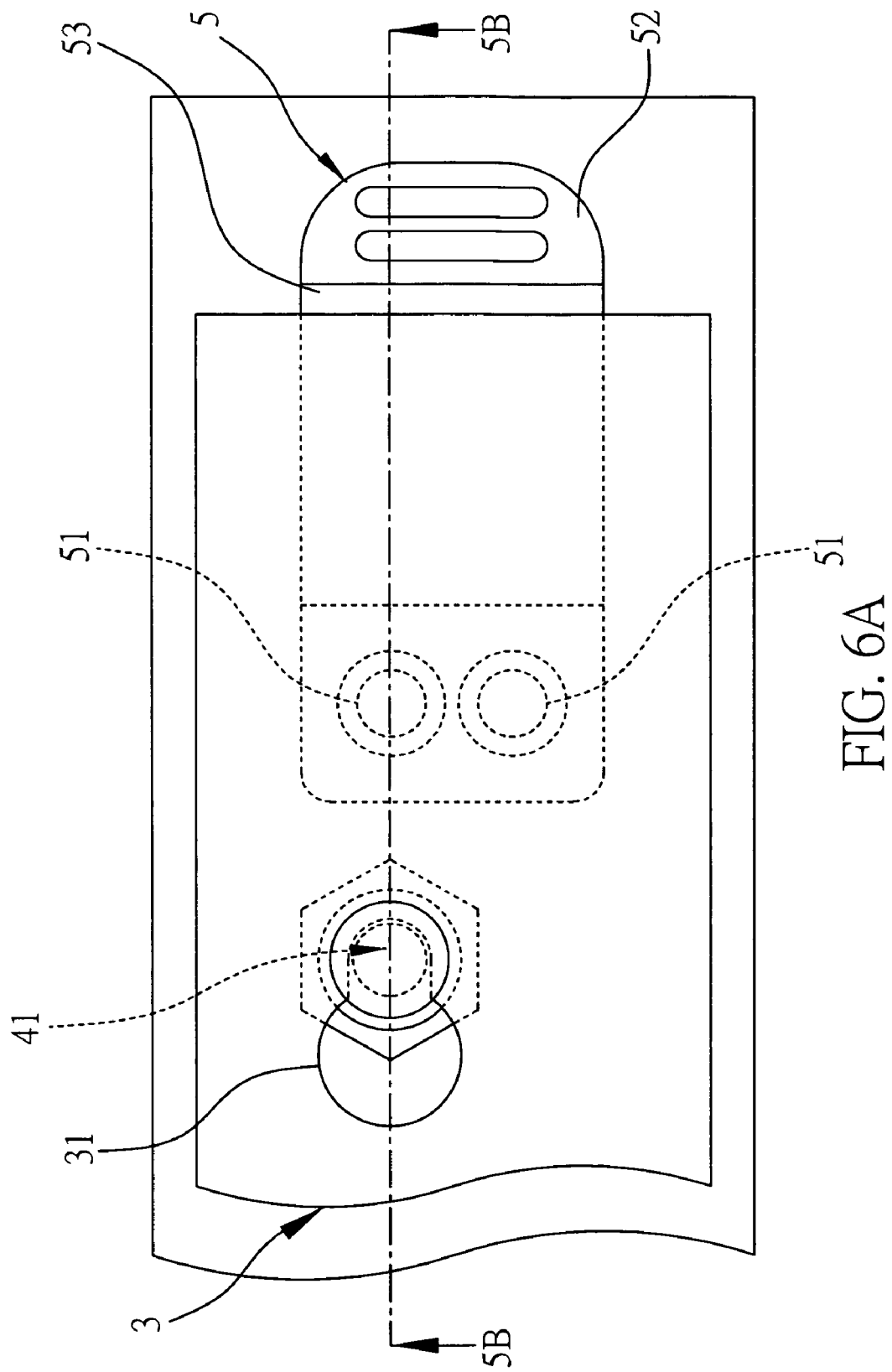
Figure 6B:
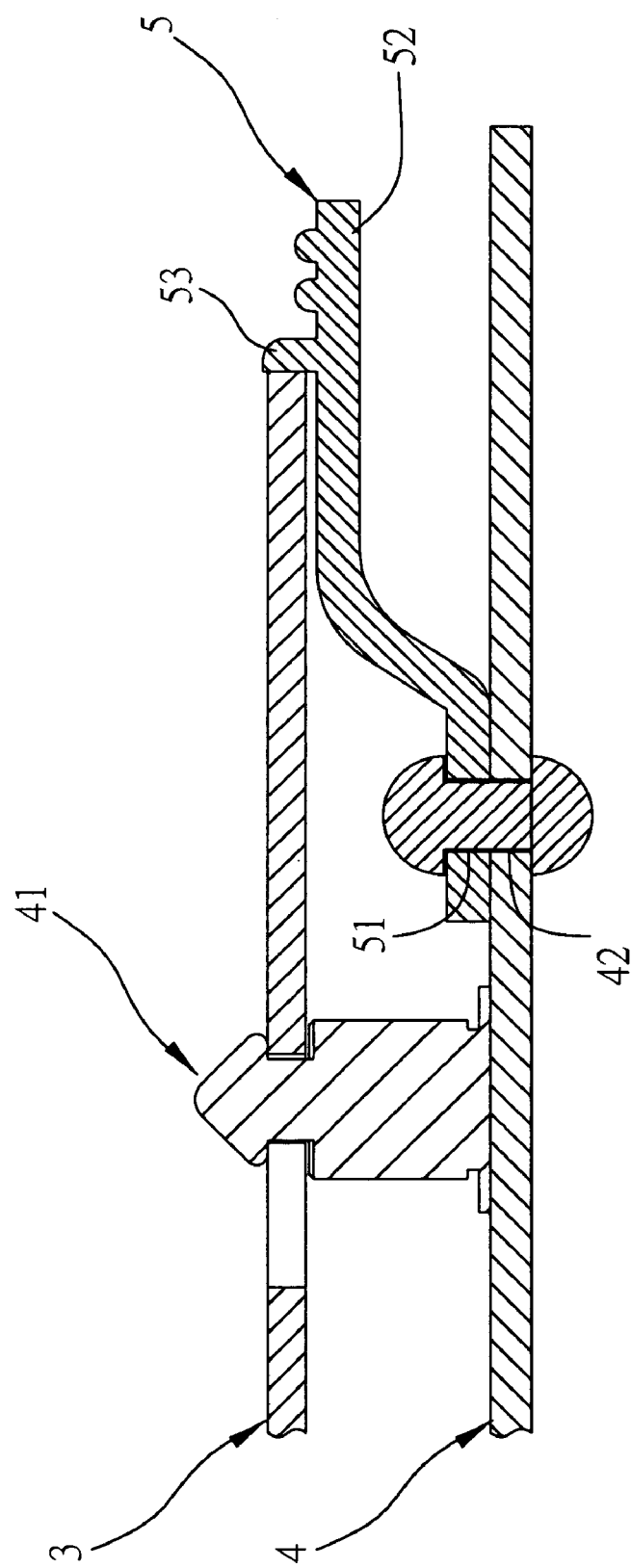

FIGS. 6A and 6B are schematic views of a fixing mechanism in accordance with a fourth embodiment of the present invention, in which FIG. 6A is a downcast view and FIG. 6B is a side cutaway view of FIG. 6A, and note that components that are identical or similar to those of the third embodiment are shown by identical or similar reference numerals and the description thereof is omitted herein for clarity and brevity.

As shown in the drawings, the planar board of this embodiment is substantially the same as the foregoing preferred embodiment, and only differs in that the fastening member 5 thereof has a shortened length.

In this embodiment, the length of the fastening member 5 between the first fixing portion 42 and the second fixing portion 51 is shortened, and the elastic portion 52 extends upward at a larger angle than that of the first embodiment to shorten the length of the elastic portion 52. Also, the second positioning portion 41 is disposed at an end of the fastening member 5 instead of on one side or penetrating through the fastening member 5 as disclosed in the first and second embodiments. Accordingly, the planar board of this embodiment produces the same effect of fixing as other embodiments even with a shortened size, thereby reducing the material cost and facilitating a miniaturization trend of electronic products.

Note that the prevent invention may include various designs according to actual requirements and preferences, the foregoing embodiments are intended to be illustrative but not limiting to all variables that may deduce from the concepts of this invention.

In summary, the present invention offers advantages over prior art techniques and is highly applicable for the industry in that it is not only simple and convenient to install and disassemble, but also is cost-effective and reliable to implement.

The aforementioned are only exemplary preferred embodiments of the present invention. The scope of the claims as stated below should be accorded the broadest interpretation so as to encompass various modifications and similar arrangements made to the herein described invention that fall within the spirit of the basic principles and technology of the present invention.

What is claimed is:

1. A fixing mechanism for fixing a planar board having a plurality of first positioning portions onto a carrier board, the fixing mechanism comprising a plurality of second positioning portions disposed on the carrier board to correspondingly couple with the first positioning portions;

at least a first fixing portion disposed on the carrier board; and a fastening member including at least a second fixing portion for connecting with the first fixing portion, a blocking portion for blocking the planar board, and an elastic portion obliquely extended from a side of the second fixing portion and connected to the blocking portion for actuating the blocking portion to block the planar board by propping up to abut against and support one side of the planar board, thereby preventing the planar board from moving in both vertical and horizontal directions for secure installation.

2. The fixing mechanism according to claim 1, wherein the second positioning portion comprises a bottom pillar, a neck pillar formed on the top of the bottom pillar, and a sharp pillar formed on the top of the neck pillar.

3. The fixing mechanism according to claim 2, wherein the neck pillar has a length equal to a thickness of the planar board.

4. The fixing mechanism according to claim 2, wherein one of the first positioning portions comprises a first arc having a first radius slightly larger than that of the sharp pillar, and a second arc having a second radius equal to that of the neck pillar.

5. The fixing mechanism according to claim 1 further comprising a rivet for fixing the first fixing portion to the second fixing portion.

6. The fixing mechanism according to claim 1, wherein the elastic portion has an extending end not equal to the second fixing portion in height.

7. The fixing mechanism according to claim 1, wherein the blocking portion is one selected from the group consisting of a protrusive rib and a stopping block.

8. The fixing mechanism according to claim 1, wherein the second fixing portion and the elastic portion are integrated with the blocking portion.

9. The fixing mechanism according to claim 1, wherein the fastening member has one selected from the group consisting of a plastic structure and a metallic structure.

10. The fixing mechanism according to claim 1, further comprising a first mating portion which is disposed on the carrier board, and a second mating portion which is disposed on one side of the fastening member in a protrusive manner for mating with the first mating portion.

11. The fixing mechanism according to claim 1, further comprising a third positioning portion which is disposed in the fastening member for allowing one of the second positioning portions to pass.

12. The fixing mechanism according to claim 11, wherein the second positioning portion comprises a bottom pillar, a neck pillar formed on the top of the bottom pillar, and a sharp pillar formed on the top of the neck pillar, and the third positioning portion is an opening having a radius larger than that of the bottom pillar.

* * * * *